United States Patent
Hirao et al.

(10) Patent No.: US 10,156,022 B2
(45) Date of Patent: Dec. 18, 2018

(54) METHOD FOR PRODUCING NITRIDE OF GROUP-13 ELEMENT, AND MELT COMPOSITION

(71) Applicant: NGK INSULATORS, LTD., Aichi-prefecture (JP)

(72) Inventors: Takayuki Hirao, Nagoya (JP); Shuhei Higashihara, Nagoya (JP); Katsuhiro Imai, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 200 days.

(21) Appl. No.: 15/046,693

(22) Filed: Feb. 18, 2016

(65) Prior Publication Data

US 2016/0168749 A1 Jun. 16, 2016

Related U.S. Application Data

(63) Continuation of application No. PCT/JP2014/071921, filed on Aug. 21, 2014.

(30) Foreign Application Priority Data

Aug. 22, 2013 (JP) .................. 2013-172463

(51) Int. Cl.
| | |
|---|---|
| C30B 19/02 | (2006.01) |
| C30B 9/10 | (2006.01) |
| C30B 19/10 | (2006.01) |
| C30B 29/40 | (2006.01) |

(52) U.S. Cl.
CPC ............... *C30B 19/02* (2013.01); *C30B 9/10* (2013.01); *C30B 19/10* (2013.01); *C30B 29/406* (2013.01)

(58) Field of Classification Search
None
See application file for complete search history.

(56) References Cited

U.S. PATENT DOCUMENTS

| | | | | |
|---|---|---|---|---|
| 3,684,560 | A | * | 8/1972 | Brichard et al. ........ B05B 7/144 239/104 |
| 7,935,550 | B2 | | 5/2011 | Dwilinski et al. |
| 8,187,507 | B2 | | 5/2012 | Mori et al. |

(Continued)

FOREIGN PATENT DOCUMENTS

| | | |
|---|---|---|
| JP | 2005-506271 | 3/2005 |
| JP | 4538596 B2 | 7/2010 |

(Continued)

OTHER PUBLICATIONS

International Search Report and Written Opinion for PCT Patent App. No. PCT/JP2014/071921 (dated Oct. 7, 2014) with English language translation of the Search Report.

(Continued)

*Primary Examiner* — Erin F Bergner
(74) *Attorney, Agent, or Firm* — Cermak Nakajima & McGowan LLP; Tomoko Nakajima

(57) ABSTRACT

It is produced a crystal of a nitride of a group 13 element in a melt including the group 13 element and a flux including at least an alkali metal under atmosphere comprising a nitrogen-containing gas. An amount of carbon is made 0.005 to 0.018 atomic percent, provided that 100 atomic percent is assigned to a total amount of said flux, said group 13 element and carbon in said melt.

5 Claims, 6 Drawing Sheets

(56) References Cited

U.S. PATENT DOCUMENTS

| | | | |
|---|---|---|---|
| 2011/0200833 A1* | 8/2011 | Kamei | .............. C30B 9/10 428/446 |
| 2012/0003446 A1 | 1/2012 | Satoh et al. | |
| 2014/0328742 A1 | 11/2014 | Mori et al. | |

FOREIGN PATENT DOCUMENTS

| | | |
|---|---|---|
| JP | 2012-012259 | 1/2012 |
| WO | WO2013/105618 A1 | 7/2013 |

OTHER PUBLICATIONS

International Preliminary Report on Patentability for PCT Patent App. No. PCT/JP2014/071921 dated Feb. 23, 2016.

\* cited by examiner

METHOD FOR PRODUCING NITRIDE OF GROUP-13 ELEMENT, AND MELT COMPOSITION

FIELD OF THE INVENTION

The present invention relates to a method of producing a nitride of a group 13 element and melt composition.

RELATED ART STATEMENT

When GaN crystal is grown by so-called flux method, it is necessary to prevent random generation of nuclei in melt and to grow GaN at a high productivity. It is disclosed that, by adjusting a content of carbon in the melt in a range of 0.02 to 5 atomic percent with respect to a total of an alkali metal flux, gallium metal and carbon, it is possible to prevent generation of nuclei in the melt and to promote the growth of GaN crystal on a non-polar surface (Patent document 1: Japanese Patent No. 4538596B).

TECHNICAL DOCUMENTS

Patent Documents (Patent document 1) Japanese Patent No. 4538596B
(Patent document 2) Japanese Patent Publication No. 2005-506271A

SUMMARY OF THE INVENTION

However, as the inventors tried to grow GaN crystal according to the growing method described in Patent document 1, it was proved that the thickness of the thus obtained GaN crystal was deviated. The deviation of the thickness of GaN crystal depending on the position causes the following problems.

First, as GaN crystal is usually grown three-dimensionally while incorporating the melt therein, the crystal contains inclusions inside of the crystal. In the case that deviation is observed in the thickness of the GaN crystal, an excessive amount of the inclusions are usually to be present inside of the crystal. If such excessive amount of inclusions is present, they are exposed to a surface of the crystal as openings after the surface is subjected to polishing. Such portion with the exposed openings cannot be used as a product. It is thus not possible to provide a crystal having a large area.

The second problem is that deviation of growth thickness in a range of several tens to several hundreds µm tends to occur locally (particularly in an outer peripheral portion of the substrate). In the case that the thus grown crystal is subjected to polishing, it is necessary to apply a load onto the crystal and to adhere the crystal onto a backing plate with a wax, for polishing the crystal in parallel with the plate. However, if deviation occurs in the thickness of the crystal before the polishing, it becomes impossible to apply the load evenly on the crystal. The crystal is thereby adhered onto the backing plate in the state that the crystal is inclined or curved unevenly. It becomes thereby impossible to process the crystal in parallel with the backing plate so that, in a device produced on the thus obtained crystal, the deterioration of properties is induced.

Further, in a region where carbon content is large, a part of carbon is not dissolved and left at the starting time of crystal growth. Carbon itself is thus deposited on the GaN seed crystal to provide the cause of prevention of the growth, so that recesses are produced in the thus grown GaN crystal.

An object of the present invention is, in growing a crystal of a nitride of a group 13 element by flux method, to prevent deviation of thickness of the thus obtained crystal of the nitride of the group 13 element and to prevent generation of the openings on a surface of the crystal.

The present invention provides a method of producing a crystal of a nitride of a group 13 element in a melt comprising the group 13 element and a flux comprising at least an alkali metal under an atmosphere comprising a nitrogen-containing gas. An amount of carbon is 0.005 to 0.018 atomic percent, provided that a total amount of said flux, said group 13 element and carbon in the melt is 100 atomic percent.

The present invention further provides a melt composition comprising a group 13 element and a flux comprising at least an alkali metal. The melt composition is for growing a crystal of a nitride of a group 13 element under an atmosphere comprising a nitrogen-containing gas. An amount of carbon is 0.005 to 0.018 atomic percent, provided that a total amount of said flux, said group 13 element and carbon in said melt is 100 atomic percent.

The inventors have found that the cause of the problems as described above is mainly due to the ununiformity of carbon concentrations in the melt. It was considered that, due to the ununiformity of the carbon concentrations in the melt, regions of higher supersaturation and lower supersaturation of nitrogen were generated, resulting in differences of growth rates and deviation in the thickness.

It was also proved that such portions with the large deviation of thickness are concentrated in a limited region such as a peripheral end part of the crystal. This can be speculated as follows. The melt tends to stay in the limited region such as the peripheral end part of the crystal to generate regions of a high supersaturation. It is considered that the crystal growth is excessively promoted in the region to result in the deviation of the thickness and excessive amount of the inclusions.

Based on these findings, the present inventors have researched the method of promoting the growth of the crystal of the nitride of the group 13 element and to prevent the deviation of the thickness of the crystal and surface openings, by adding carbon into the melt. As a result, it was found that the problems can be solved, by making a carbon content 0.005 to 0.018 atomic percent, provided that 100 atomic percent is assigned to a total amount of the flux, the group 13 element and carbon in the melt composition. The inventors thus accomplished the invention.

Besides, according to the description of patent document 1, it is necessary to make a carbon amount 0.02 atomic percent or higher, provided that 100 atomic percent is assigned to a total amount of the flux, the group 13 element and carbon in the melt composition. It is not also described a comparative example that the carbon content is made less than 0.02 atomic percent, which have been overlooked.

EMBODIMENTS FOR CARRYING OUT THE INVENTION

Flux Containing at Least Alkali Metal

Figure 1A:
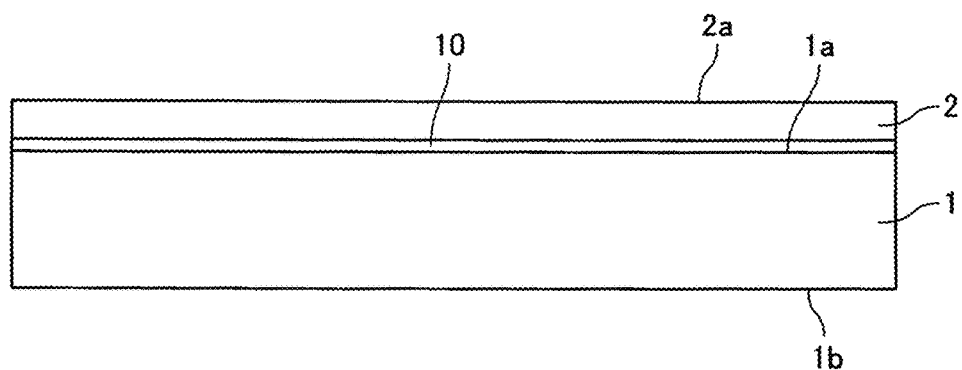
FIG. 1(a) is a view schematically showing a composite substrate composed of a supporting body 1, a seed crystal film 2 and a crystal of a nitride of a group 13 element.

The alkali metal in the melt composition functions as a flux in liquid epitaxial growth. Such alkali metal includes lithium (Li), sodium (Na), potassium (K), rubidium (Rb), cesium (Cs) and francium (Fr). Among them, Li and/or Na are preferred, and Na is more preferred.

Further, the flux includes an alkaline earth metal other than the alkali metal. Specifically, calcium (Ca), magnesium (Mg), strontium (Sr), barium (Ba) and radium (Ra) are listed.

The content of the alkali metal may preferably be 80 weight parts or larger, more preferably be 90 weight parts or larger and may be 100 weight parts, provided that the content of the flux is 100 weight parts.

A dopant or impurity may be contained further in the melt. Such component includes nitrogen, a nitride, silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO) and germanium (Ge). As such nitride, for example, $Ca_3N_2$, $Li_3N$, $NaN_3$, BN, $Si_3N_4$, InN or the like may be listed.

(Group 13 Element)

A group 13 element is contained in the melt composition. The group 13 element means group 13 element according to the Periodic Table determined by IUPAC. The group 13 element is specifically gallium, aluminum, indium, thallium or the like. Further, the nitride of the group 13 element grown by the present invention may particularly preferably be boron nitride (BN), aluminum nitride (AlN), gallium nitride (GaN), indium nitride (InN), thallium nitride (TlN), or the mixed crystals thereof such as AlGaN, AlGaInN or the like.

As a raw material of the group 13 element, a simple metal of the group 13 element may be used, and an alloy or a compound of the group 13 element may be used. The simple metal of the group 13 element is more preferred.

(Carbon in Melt Composition)

Raw material of carbon added to the melt composition may be pure carbon or a carbon compound. Further, the raw material of carbon may be solid, liquid organic compound or a gaseous organic compound.

Such pure carbon includes powder such as graphite, diamond, fullerene, carbon nanotubes or the like, and a carbon sheet. Further, the carbon compound includes an organic compound such as a cyanide, and an organic compound such as methane, ethane, propane, butane, benzene or the like.

In the case that carbon powder is used as the carbon source, on the viewpoint of ease of handling of carbon powder, the average particle size of the carbon powder may preferably be 1 µm or larger and more preferably be 5 µm or larger. Further, on the viewpoint of preventing generation of openings on the crystal surface due to insufficient dissolution of the carbon powder, the average particle size of the carbon powder may preferably be 120 µm or smaller, more preferably be 100 µm or smaller and most preferably be 50 µm or smaller.

(Composition Ratios of the Melt)

According to the present invention, the amount of carbon is made 0.005 to 0.018 atomic percent, provided that 100 atomic percent is assigned to a total of contents of the flux, group 13 element and carbon in the melt.

By making the amount of carbon 0.005 atomic percent or higher, it is possible to prevent generation of miscellaneous crystals and to grow the crystal of the nitride of the group 13 element. On the viewpoint, the amount of carbon may more preferably be made 0.008 atomic percent or higher.

Further, by making the amount of carbon 0.018 atomic percent or lower, it is possible to prevent the deviation of the thickness of the thus obtained crystal and to prevent the generation of the recesses on the crystal surface. On the viewpoint, the amount of carbon may preferably be made 0.015 atomic percent or lower.

The amount of the group 13 element may preferably be 10 to 35 atomic percent and more preferably be 15 to 25 atomic percent, provided that 100 atomic percent is assigned to a total content of the flux, the group 13 element and carbon in the melt.

Single crystal referred to in the present specification is defined as follows. Although single crystal includes typical single crystals where atoms are regularly arranged throughout the whole of the crystal, "single crystal" is not limited to such typical ones and includes those generally referred to in the Industries. That is, single crystal may include a some degree of defects, or may include internal stress, or may contain impurities in the crystal structure, and includes those called single crystal which is distinguishable from polycrystals (ceramics).

The present invention will be described further in detail, referring to the drawings if appropriate.

Figure 1B:
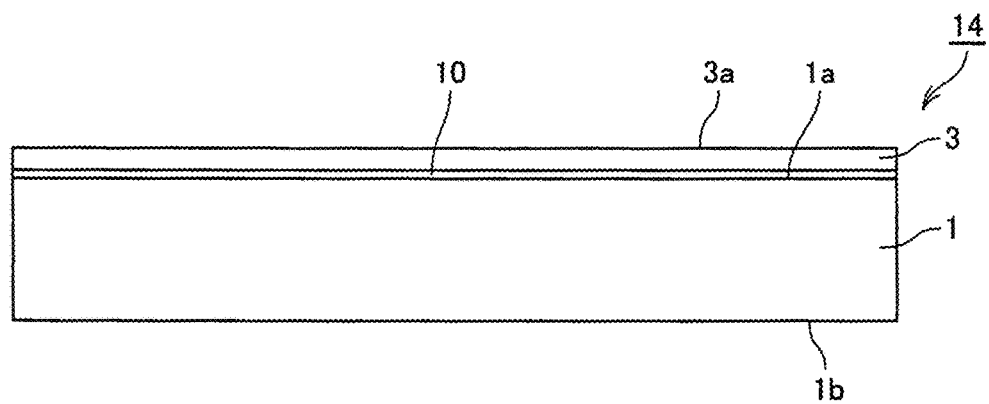
FIG. 1(b) is a view schematically showing a composite substrate 14 after the crystal 2 of the nitride of the group 13 element of the composite substrate of FIG. 1(a) is polished.

For example, as shown in FIG. 1(a), a seed crystal layer 10 is formed on a main face 1a of a supporting body 1. 1b represents another main face of the supporting body 1. Then, a crystal layer 2 of a nitride of a group 13 element is formed on the seed crystal layer 10 by flux method. Then, as shown in FIG. 1(b), a surface 2a of the crystal layer 2 of the nitride of the group 13 element is polished to obtain a polished crystal layer 3 of the nitride of the group 13 element. 3a represents a polished surface and 14 represents a composite substrate.

Here, as described above, the thickness of the grown crystal layer 2 of the nitride of the group 13 element may be deviated, so that the polishing became difficult. Further, after the crystal layer 2 of the nitride of the group 13 element was polished, the recesses may be generated on the polished surface as described above. The present invention provides solution to those problems.

(Supporting Body)

The material of the supporting body includes sapphire, an AlN self-standing body, a GaN self-standing body, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$ and $NdGaO_3$ and SCAM ($ScAlMgO_4$). Also, it is possible to use cubic perovskite structure composite oxides represented by the composition formula $[A_{1-y}(Sr_{1-x}Ba_x)_y][(Al_{1-z}Ga_z)_{1-u}D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2).

For preventing the peeling of the nitride crystal of the group 13 element from the supporting body, the thickness of the supporting body may preferably be made larger than that of the nitride crystal of the group 13 element. On the viewpoint, the thickness of the supporting body may preferably be 200 to 2000 µm and more preferably be 300 to 1000 µm.

(Underlying Layer)

An underlying layer may be formed on the supporting body. Such underlying layer is formed by vapor phase growth method, including metal organic chemical vapor deposition (MOCVD), hydride vapor phase epitaxy (HVPE), MBE method and sublimation method.

Although the thickness of the underlying layer is not particularly limited, the thickness may preferably be 0.01 µm or larger and more preferably be 0.1 µm or larger. Further, if it is too thick, it would take a long time for the film-formation to deteriorate the efficiency. The thickness is thus preferably 3.0 µm or smaller and more preferably be 1.5 µm or smaller. Further, the material of the underlying layer may preferably be a nitride of a group 13 element as described later.

(Seed Crystal)

A seed crystal film may be formed on the supporting body or on the underlying layer. Alternatively, a self-standing body of the seed crystal may be used.

The seed crystal layer may be composed of a single layer or plural layers. Further, the seed crystal film may preferably be formed by vapor phase epitaxy process, for example, including metal organic chemical vapor deposition (MOCVD), hydride vapor phase epitaxy (HVPE), pulse excited deposition (PXD), MBE method and sublimation method. Metal organic chemical vapor deposition process is particularly preferable.

The material forming the seed crystal and underlying layer may preferably be a nitride of a group 13 element, and boron nitride (BN), aluminum nitride (AlN), gallium nitride (GaN), indium nitride (InN), thallium nitride (TlN), or the mixed crystals thereof (AlGaN, AlGaInN or the like) are particularly preferred.

A material constituting the seed crystal is particularly preferably gallium nitride exhibiting yellow luminescence effect observed by a luminescence micro scope.

The gallium nitride exhibiting the yellow luminescence will be described below.

It is observed, in addition to exciton transition (UV) from a band to a band, a broad peak in a range of 2.2 to 2.5 eV in the gallium nitride crystal. This is called yellow luminescence (YL) or yellow band (YB).

By applying a fluorescence microscope, it is possible to excite only the yellow luminescence in this range and to detect the presence or absence of the yellow luminescence.

Such yellow luminescence is derived from radiation process relating to native defects, such as nitrogen defects, originally present in the crystal. Such defects provide luminescent centers. Probably, it is considered that impurities of transition metal such as Ni, Co, Cr, Ti derived from the reacting condition would be taken into the gallium nitride crystal to form the luminescent centers of the yellow band.

Such gallium nitride crystal exhibiting the yellow luminescence is exemplified in Japanese Patent Publication No. 2005-506271A, for example.

(Crystal of Nitride of Group 13 Element)

Wurtzite-type structure of the crystal of the nitride of the group 13 element grown by flux method includes c-face, a-face and m-face. Each of these crystalline faces is defined based on crystallography. The underlying layer, seed crystal layer and the crystal of the nitride of the group 13 element grown by flux method may be grown in a direction normal with respect to c-face, or each of normal line directions of a-face and m-face.

The thickness (thickness direct after the film-formation) of the crystal of the nitride of the group 13 element is not particularly limited. However, in the case that the crystal of the nitride of the group 13 element and supporting body are separated spontaneously, it could not be used as a composite substrate. Therefore, on the viewpoint of preventing the separation of the nitride of the group 13 element, the thickness (direct after the film-formation) of the crystal of the nitride of the group 13 element may preferably be 1000 µm or smaller, more preferably be 500 µm or smaller, still more preferably be 300 µm or smaller and most preferably be 200 µm or smaller.

Further, the thickness of the crystal of the nitride of the group 13 element may preferably be 10 µm or larger and more preferably be 20 µm or larger, on the viewpoint of eliminating threading dislocations of the seed crystal during the growth of gallium nitride by flux method to improve the crystallinity at the uppermost surface.

(Condition of Flux Method)

The nitrogen-containing gas may be any gas as far as it includes nitrogen atom. It includes, for example, nitrogen ($N_2$) gas, ammonia ($NH_3$) gas or the like, and they can be mixed with each other with the mixing ratio being not limited.

The growth temperature of the crystal in the flux method and the holding time during the growth are not particularly limited, and they are appropriately changed in accordance with a composition of the flux. As an example, when the gallium nitride crystal is grown using a flux containing sodium or lithium, the growth temperature may be preferably set to 800° C. to 950° C., and more preferably set to 850 to 900'C.

According to the flux method, although the pressure of the atmosphere is not particularly limited, the pressure may preferably be 10 atms or higher and more preferably be 30 atms or higher, on the viewpoint of preventing the evaporation of the flux. However, as the pressure is high, an apparatus becomes large. Therefore, the total pressure of the atmosphere may preferably be set to 2000 atm or less, and further preferably 500 atm or less. Any other gas except the nitrogen-containing gas in the atmosphere is not limited; but an inert gas may be preferably used, and argon, helium, or neon may be particularly preferably used.

It is grown a nitride single crystal including inclusions each having a size of several microns only in a region of 50 µm in the initial stage of the crystal growth by the flux method. It is thereby possible to considerably reduce the dislocations of the crystal resulting in good properties suitable for various kinds of devices.

"Inclusion" referred to herein means a heterogenous phase included in the nitride film and composed of a material derived from components contained in the melt. The components contained in the melt means the flux (alkali metals such as sodium), gallium element and the other additives.

The additives include carbon, metals of low melting points (tin, bismuth, silver, gold), and metals of high melting points (iron, manganese, titanium, chromium and the other transition metals). The metal of low melting point may be added for preventing oxidation of sodium, and metal of high melting point may be contained from a container for containing a crucible, a heater of a growing furnace or the like.

The material forming the inclusion is typically an alloy of the flux and gallium, mixture of the simple metal and the alloy, or carbon, or aggregate or polycrystalline material of fine crystals of gallium nitride. For example, it includes a Stoichiometric alloy such as $Ga_4Na$, $Ga_2Na_3$ and mixture of $Ga_2O_3$ and $Al_2O_3$.

(Agitation of Melt Composition)

According to the present invention, it is preferred to agitate the melt composition well, so that a relatively low concentration of carbon is dispersed and dissolved in the whole melt uniformly to prevent the generation of regions of a high concentration or low concentration. On the viewpoint, it is preferred to rotate a container to agitate the melt. In this case, the rotational direction of the container may be inverted or the container may be rotated in a single direction. In the case that the container is rotated in a single direction, the rotational rate is preferably set in a range of 1 to 100 rpm, for example. Further, in the case that the rotational direction of the container is inverted, the rotational rate is preferably set in a range of 1 to 100 rpm, for example.

It is further preferred to stop the rotation of the container intermittently. In this case, a time period of stopping the rotation may preferably be 0.1 to 60 seconds and more preferably be 1 to 30 seconds. Further, the time periods and rotational speed of rotating the container before and after the time period of stopping the rotation may preferably be 5 to 1200 seconds and 1 to 100 rpm, respectively.

Further, by making the depth of the melt in the container small, it is possible to facilitate the inclusion in the crystal in the initial stage and to prevent the openings on the polished surface. For this, it is preferred to use a container having a small height and to put the seed crystal substrate horizontally on the bottom of the crucible in the melt. Further, it is preferred to laminate a plurality of the crucibles each having a small height. Similarly, it is possible to facilitate the inclusion in the initial stage, by making an unsaturated time period before the crystal growth shorter. At the same time with these, by adjusting the rotational speed as described above, it is possible to prevent the generation of the inclusions after the initial stage of the growth is over. Besides, the unsaturated time period means a time period that the melt is not saturated yet and the crystal growth is not started.

(Processing of Crystal of Nitride of Group 13 Element)

It is preferred to process the crystal of the nitride of the group 13 element to make the crystal thinner. Such processing includes the followings.

Grinding is that an object is contacted with fixed abrasives, obtained by fixing the abrasives by a bond and rotating at a high rotation rate, to grind a surface of the object. By such grinding, a roughed surface is formed. In the case that a bottom face of a composite substrate is ground, it is preferably used the fixed abrasives containing the abrasives, composed of SiC, $Al_2O_3$, diamond, CBN (cubic boron nitride, same applies below) or the like having a high hardness and having a grain size of about 10 µm to 100 µm.

Further, lapping is that a surface plate and an object are contacted while they are rotated with respect to each other through free abrasives (they mean abrasives which are not fixed, same applies below), or fixed abrasives and the object are contacted while they are rotated with respect to each other, to polish a surface of the object. By such lapping, it is formed a surface having a surface roughness smaller than that in the case of the grinding and larger than that in the case of micro lapping (polishing). It is preferably used abrasives composed of SiC. $Al_2O_3$, diamond, CBN or the like having a high hardness and having a grain size of about 0.5 µm to 15 µm.

Although the thickness of the crystal of the nitride of the group 13 element after the processing is not particularly limited according to the viewpoint of the present invention the thickness may preferably be 700 µm or smaller, more preferably be 200 µm or smaller and most preferably be 100 µm or smaller, for example.

(Functional Layer and Functional Device)

A functional layer is formed on the thus obtained composite substrate by vapor phase process.

The functional layer may be composed of a single layer or a plurality of layers. Further, as the functions, it may be used a white LED with high brightness and improved color rendering index, a blue-violet laser disk for high-speed and high-density optical memory, a power device for an inverter for a hybrid car or the like.

As a semiconductor light emitting diode (LED) is produced on the composite substrate by a vapor phase process, preferably by metal organic vapor phase deposition (MOCVD) method, the dislocation density inside of the LED can be made comparable with that of the composite substrate.

The film-forming temperature of the functional layer may preferably be 950° C. or higher and more preferably be 1000° C. or higher, on the viewpoint of the film-formation rate. Further, on the viewpoint of preventing defects, the film-forming temperature of the functional layer may preferably be 1200° C. or lower and more preferably be 1150° C. or lower.

The material of the functional layer may preferably be a nitride of a group 13 element. The group 13 element specifically includes gallium, aluminum, indium, thallium or the like. Further, as a dopant for imparting n-type conductivity, silicon, germanium and oxygen are listed. As a dopant for imparting p-type conductivity, magnesium and zinc are listed.

Figure 2A:
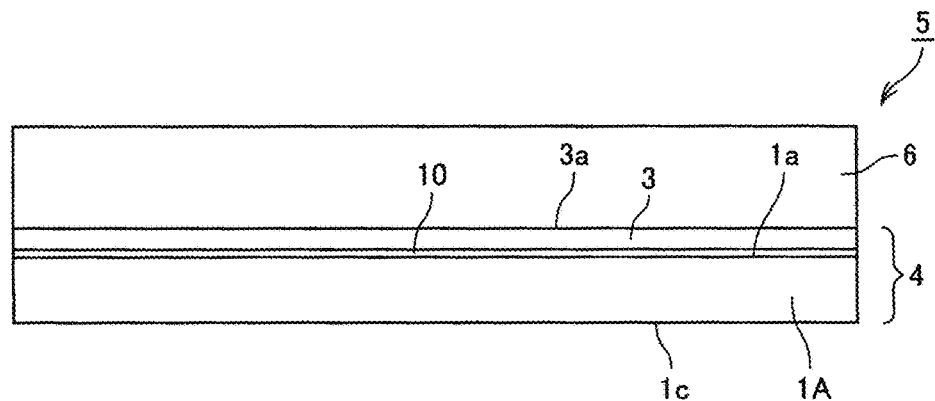
FIG. 2(a) is a diagram schematically showing a functional device 5.
Figure 2B:
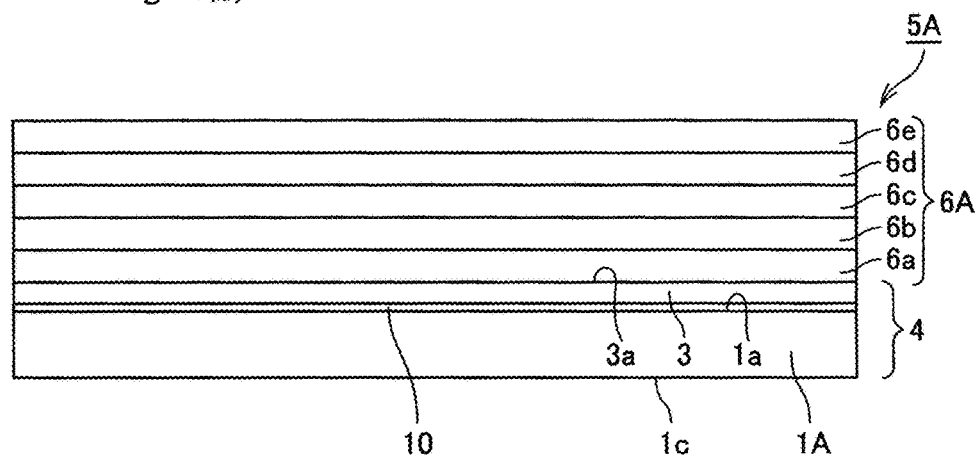
FIG. 2(b) is a diagram schematically showing a light emitting device 5A.

A functional layer 6 is formed on the composite substrate 4 to obtain a functional device 5, as shown in FIG. 2 (*a*). Here, a plurality of the functional layers 6 may be formed. For example, according to an embodiment of FIG. 2(*b*), a light emitting device structure is composed of a plurality of layers 6*a*, 6*b*, 6*c*, 6*d* and 6*e* to obtain a light emitting device structure. It is thereby possible to obtain a light-emitting device structure having a low dislocation density, so that the internal quantum efficiency of the light emitting device 5A can be improved.

EXAMPLES

Inventive Example 1

Gallium nitride crystal was grown using a crystal growth furnace. The procedure will be described as follows.

First, a seed crystal substrate is positioned horizontally on a bottom of a crucible having an inner diameter φ of 70 mm in a glove box filled with argon atmosphere. The seed crystal substrate was produced by depositing a GaN film 10 (thickness of 5 µm) on a sapphire substrate 1 of φ 2 inches by MOCVD process.

20 grams of sodium metal, 15 grams of gallium metal and 2 mg of carbon powder having an average particle size of 100 µm were filled in the crucible. The contents of carbon and gallium were 0.018 atomic percent and 20 atomic percent, provided that 100 atomic percent is assigned to a total content of sodium, gallium and carbon.

The crucible was contained in an inner container made of stainless steel, and the inner container was then contained in an outer container. An opening of the outer container main body was closed with an outer container lid equipped with a nitrogen introducing pipe. The outer container was then mounted on a rotatable table which was subjected to vacuum baking in advance, and a pressure container was sealed with a lid. Then, the inside of the pressure container was suctioned to vacuum with a vacuum pump to a pressure of 0.1 Pa or lower. Then, while the temperature in the heating space is heated at 865° C., nitrogen gas was introduced from a nitrogen gas bombe to a pressure of 4.0 MPa. The outer container was rotated around the central axis at a rotational rate of 20 rpm clockwise and ant-clockwise at a predetermined interval. The acceleration time period was made 12 seconds, retention time period was made 600 seconds, deceleration time period was made 12 seconds, and stopping time period was made 0.5 second. The container was held for 30 hours under these conditions. Thereafter, the container was naturally cooled to room temperature, and the lid of the pressure container was opened to draw the crucible from the inside. Ethanol was then charged into the crucible to dissolve the sodium metal in the ethanol, and the grown gallium nitride crystal plate was collected.

Figure 3:
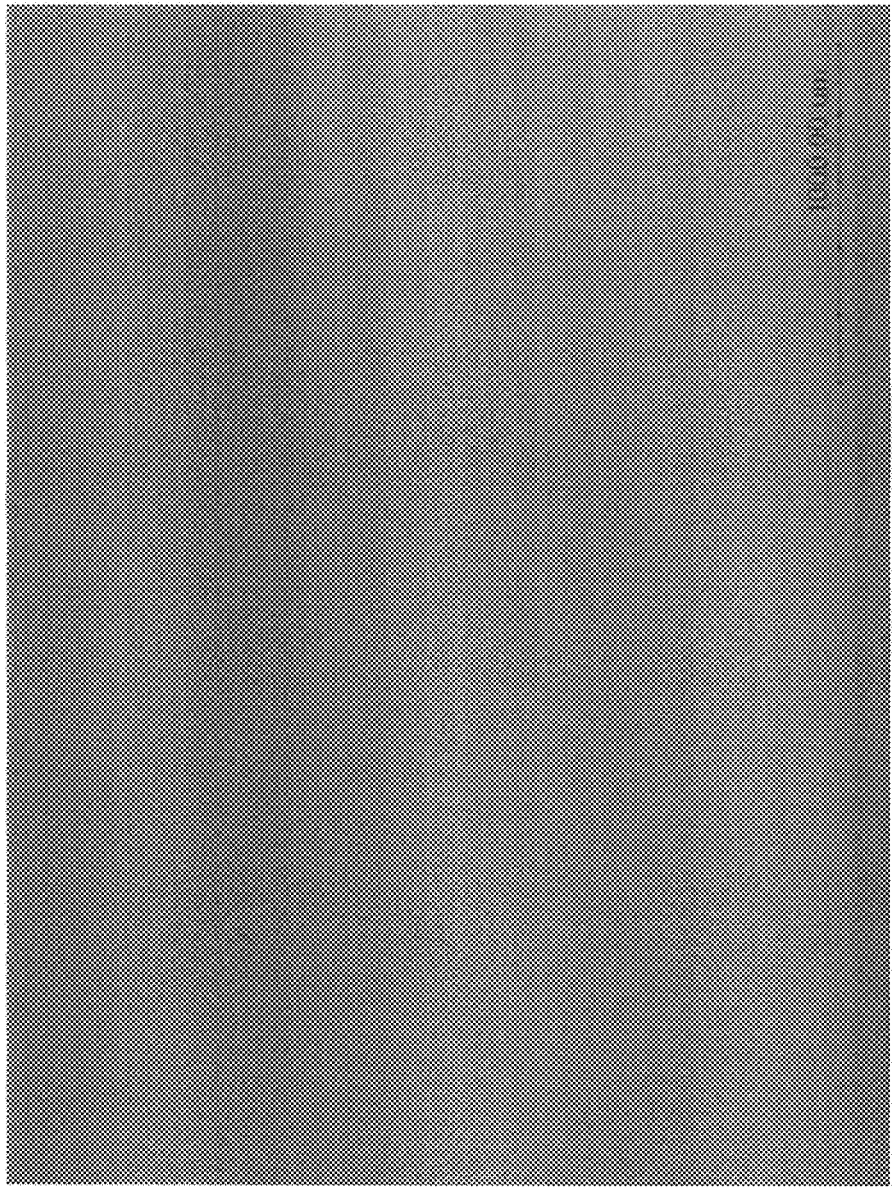
FIG. 3 shows an image, taken by an optical microscope, of a polished surface of GaN crystal obtained in example 1.

The thus obtained gallium nitride crystal plate had a size φ of 2 inches and was grown on the seed crystal substrate by a thickness of about 0.1 mm. It was measured the thicknesses at the center and additional four points positioned in the upper, lower, right and left sides with respect to the center by distances of 20 mm, respectively. The TTV value was thereby calculated and the deviation was proved to be 7 μm. "TTV" is an abbreviation of "Total thickness variation". It means, herein, a difference between the maximum value and minimum value of the thicknesses of the thus grown nitride crystal of the group 13 element, at a total of the five points of the center and the points in the upper, lower, right and left sides with respect to the center by distances of 20 mm, respectively. After the polishing, the surface of the GaN crystal was observed by an optical microscope to confirm good GaN crystal without the recesses (refer to FIG. 3. An image taken by the optical microscope (magnitude×50)).

Inventive Example 2

Figure 4:
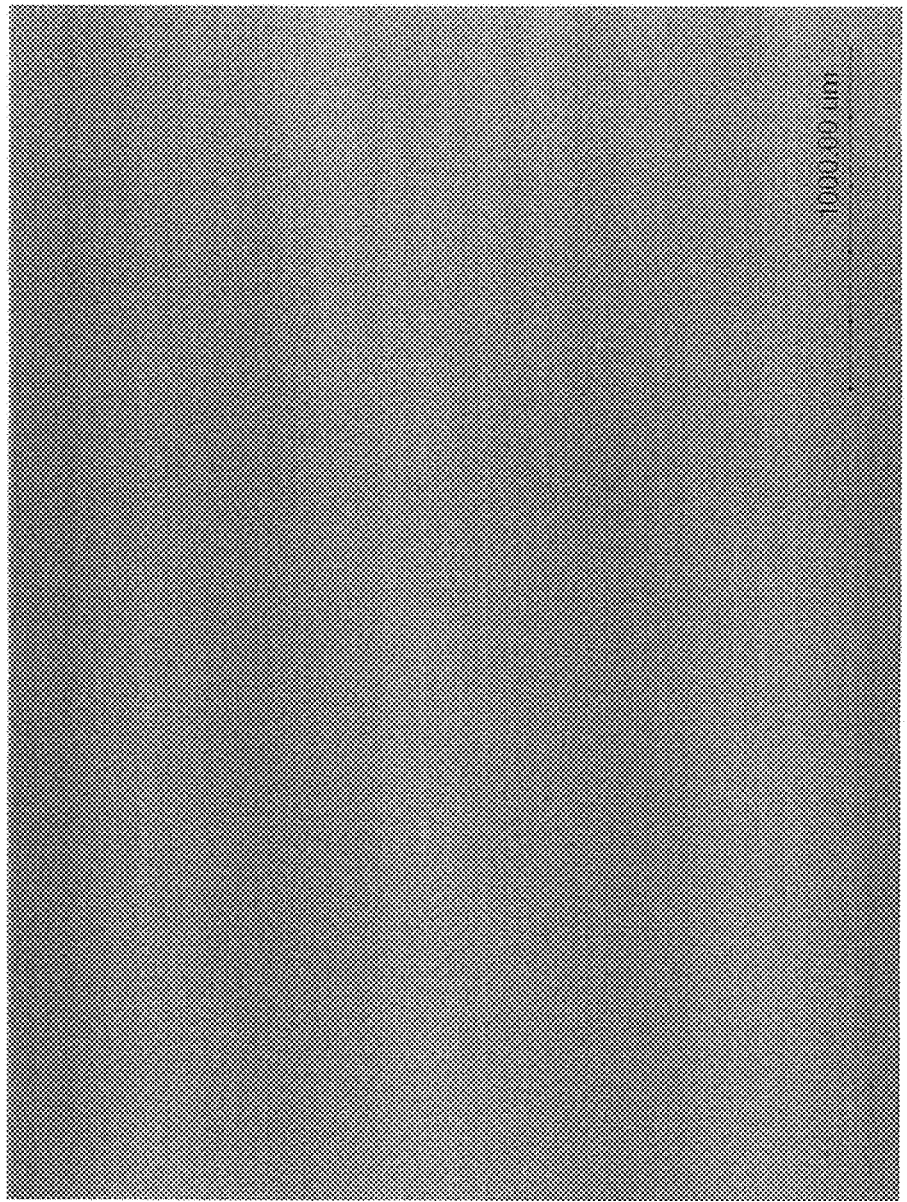
FIG. 4 shows an image, taken by an optical microscope, of a polished surface of GaN crystal obtained in example 2.

GaN crystal was grown according to the same procedure as the Inventive Example 1. However, the conditions were changed as follows.
Average particle size of carbon powder: 1 μm
Carbon content: 0.005 atomic percent
Content of gallium: 20 atomic percent
Time period for acceleration of rotation: 12 seconds
Retention time period for rotation: 600 seconds
Rotational rate: 20 rpm
Time period for deceleration: 12 seconds
Time period of stopping rotation: 0.5 second
Growth time: 30 hours The thus obtained gallium nitride crystal plate had a size φ of 2 inches and was grown on the seed crystal substrate by a thickness of about 80 μm. It was measured the thicknesses at the center and additional four points positioned in the upper, lower, right and left sides with respect to the center by distances of 20 mm, respectively. The TTV value was thereby calculated and the deviation was proved to be 5 μm. After the polishing, the surface of the GaN crystal was observed by an optical microscope to confirm good GaN crystal without the recesses (refer to FIG. 4. An image taken by the optical microscope (magnitude×50)).

Inventive Example 3

Figure 5:
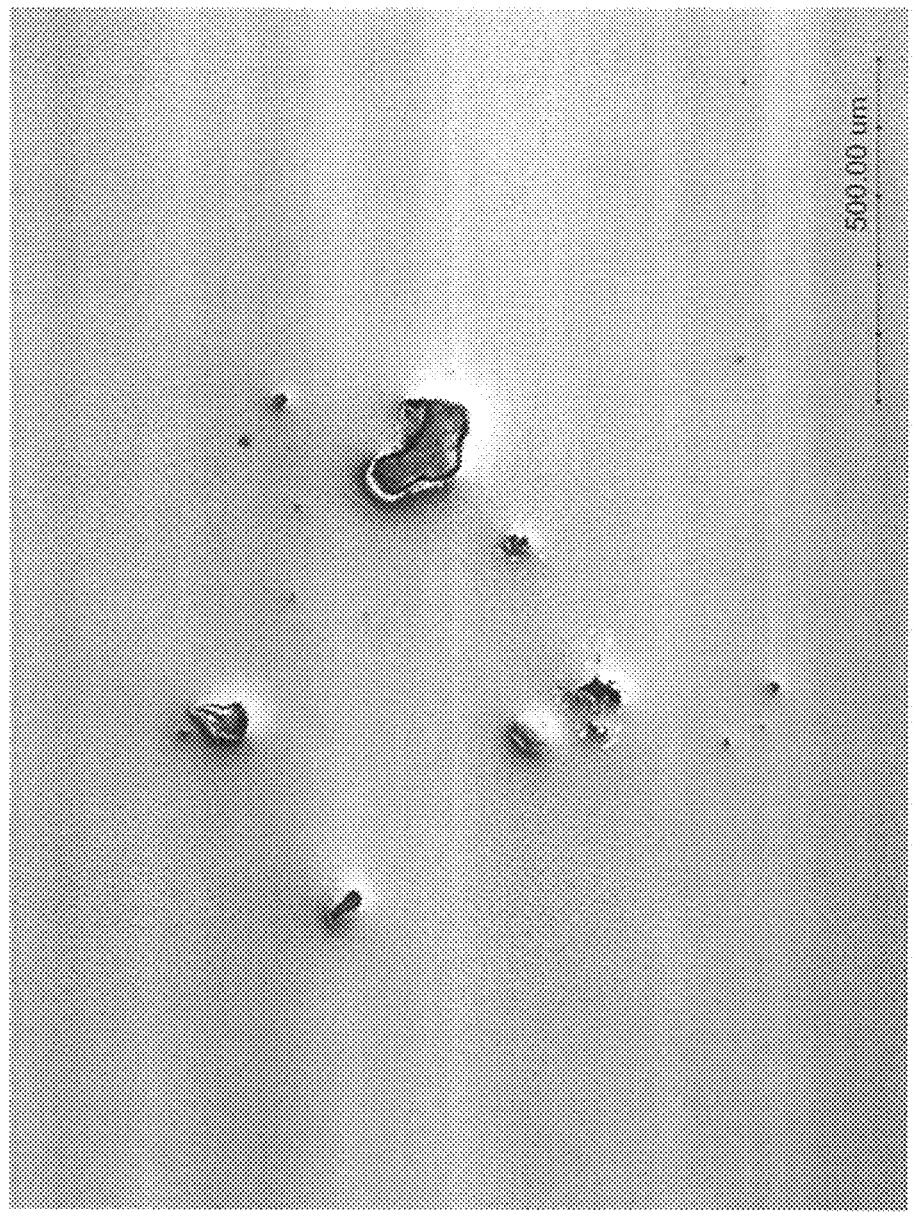
FIG. 5 shows an image, taken by an optical microscope, of a polished surface of GaN crystal obtained in example 3.

GaN crystal was grown according to the same procedure as the Inventive Example 1. However, the conditions were changed as follows.
Average particle size of carbon powder: 200 μm
Carbon content: 0.018 atomic percent
Content of gallium: 20 atomic percent
Time period for acceleration of rotation: 12 seconds
Retention time period for rotation: 600 seconds
Rotational rate: 20 rpm
Time period for deceleration: 12 seconds
Time period of stopping rotation: 0.5 second
Growth time: 30 hours The thus obtained gallium nitride crystal plate had a size φ of 2 inches and was grown on the seed crystal substrate by a thickness of 110 μm. It was measured the thicknesses at the center and additional four points positioned in the upper, lower, right and left sides with respect to the center by distances of 20 mm, respectively. The TTV value was thereby calculated and the deviation was proved to be 20 μm. After the polishing, the surface of the GaN crystal was observed by an optical microscope to confirm good GaN crystal with the opennings on the crystal surface (refer to FIG. 5. An image taken by the optical microscope (magnitude×50)). A number of the recesses having a size of 100 μm or larger was 10 or smaller, and it was hardly observed openings having a size less than 100 μm.

Comparative Example 1

Figure 6:
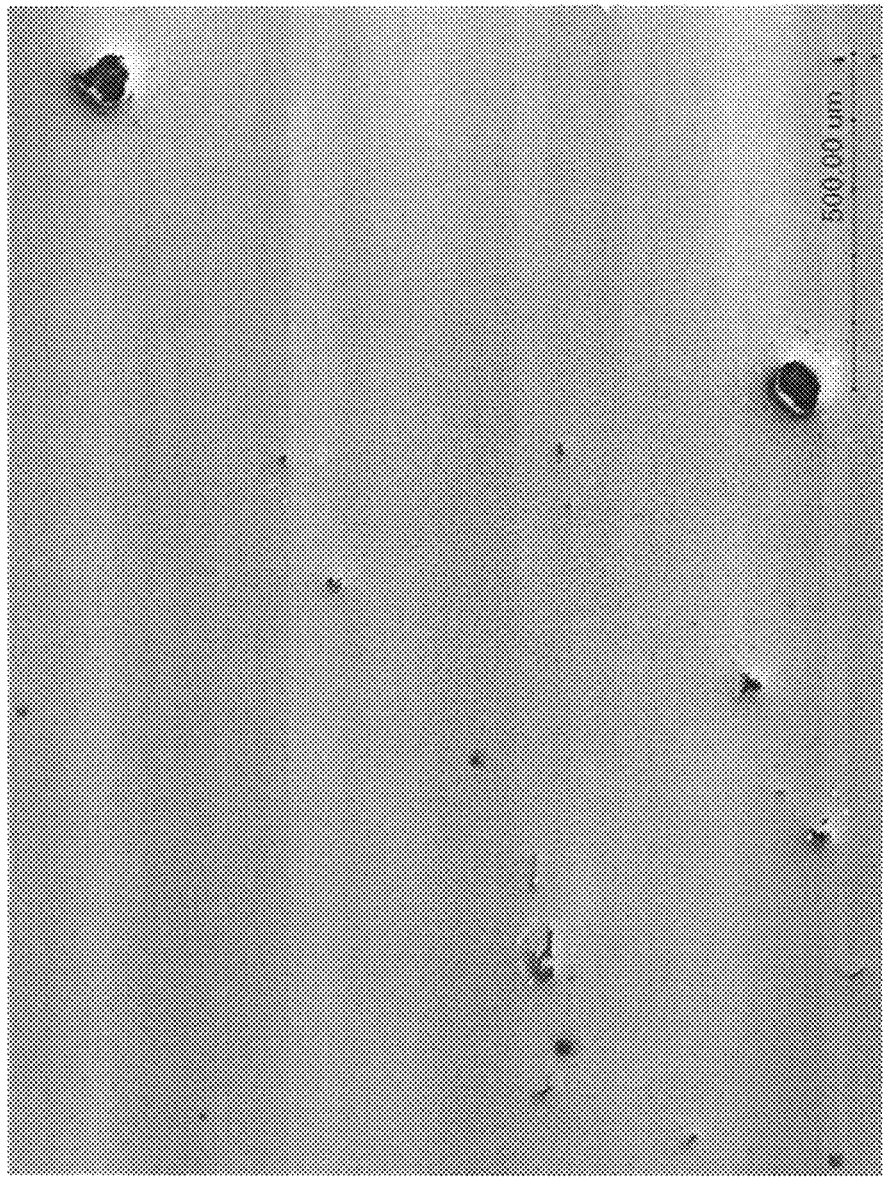
FIG. 6 shows an image, taken by an optical microscope, of a polished surface of GaN crystal obtained in comparative example 1.

GaN crystal was grown according to the same procedure as the Inventive Example 1. However, the conditions were changed as follows.
Average particle size of carbon powder: 50 μm
Carbon content: 0.020 atomic percent
Content of gallium: 20 atomic percent The thus obtained gallium nitride crystal plate had a size φ of 2 inches and was grown on the seed crystal substrate by a thickness of 120 μm. It was measured the thicknesses at the center and additional four points positioned in the upper, lower, right and left sides with respect to the center by distances of 20 mm, respectively. The TTV value was thereby calculated and the deviation was proved to be 15 μm. After the polishing, the surface of the GaN crystal was observed by an optical microscope to confirm good GaN crystal with the openings on the crystal surface (refer to FIG. 6. An image taken by the optical microscope (magnitude× 50)). A number of the openings having a size of 100 μm or larger was 50 or more, and a number of the openings having a size less than 100 μm was 100 or more.

Comparative Example 2

GaN crystal was grown according to the same procedure as the Inventive Example 1. However, the conditions were changed as follows.
Average particle size of carbon powder: 50 μm
Carbon content: 0.003 atomic percent
Content of gallium: 20 atomic percent As a result, a large amount of GaN miscellaneous crystals was generated on an inner wall face of the crucible, and GaN crystal was not grown on the seed crystal substrate.

Inventive Example 4

GaN crystal was grown according to the same procedure as the Inventive Example 1. However, the conditions were changed as follows.
Average particle size of carbon powder: 50 μm
Carbon content: 0.015 atomic percent
Content of gallium: 20 atomic percent The thus obtained gallium nitride crystal plate had a size φ of 2 inches and was grown on the seed crystal substrate by a thickness of 90 μm. It was measured the thicknesses at the center and additional four points positioned in the upper, lower, right and left sides with respect to the center by distances of 20 mm, respectively. The TTV value was thereby calculated and the deviation was proved to be 6 µm. After the polishing, the surface of the GaN crystal was observed by an optical microscope to confirm good GaN crystal without the openings.

Inventive Example 5

GaN crystal was grown according to the same procedure as the Inventive Example 1. However, the conditions were changed as follows.
Average particle size of carbon powder: 50 µm
Carbon content: 0.008 atomic percent
Content of gallium: 20 atomic percent
The thus obtained gallium nitride crystal plate had a size φ of 2 inches and was grown on the seed crystal substrate by a thickness of 85 µm. It was measured the thicknesses at the center and additional four points positioned in the upper, lower, right and left sides with respect to the center by distances of 20 mm, respectively. The TTV value was thereby calculated and the deviation was proved to be 5 µm. After the polishing, the surface of the GaN crystal was observed by an optical microscope to confirm good GaN crystal without the openings.

Inventive Example 6

GaN crystal was grown according to the same procedure as the Inventive Example 1. However, the conditions were changed as follows.
Average particle size of carbon powder: 120 µm
Carbon content: 0.018 atomic percent
Content of gallium: 20 atomic percent
The thus obtained gallium nitride crystal plate had a size φ of 2 inches and was grown on the seed crystal substrate by a thickness of 100 µm. It was measured the thicknesses at the center and additional four points positioned in the upper, lower, right and left sides with respect to the center by distances of 20 mm, respectively. The TTV value was thereby calculated, and the deviation was proved to be 10 µm and slightly larger. After the polishing, the surface of the GaN crystal was observed by an optical microscope to confirm good GaN crystal without the openings.

Inventive Example 7

GaN crystal was grown according to the same procedure as the Inventive Example 1. However, the conditions were changed as follows.
Average particle size of carbon powder: 50 µm
Carbon content: 0.018 atomic percent
Content of gallium: 20 atomic percent
The thus obtained gallium nitride crystal plate had a size φ of 2 inches and was grown on the seed crystal substrate by a thickness of 100 µm. It was measured the thicknesses at the center and additional four points positioned in the upper, lower, right and left sides with respect to the center by distances of 20 mm, respectively. The TTV value was thereby calculated and the deviation was proved to be 7 µm. After the polishing, the surface of the GaN crystal was observed by an optical microscope to confirm good GaN crystal without the openings.

Inventive Example 8

GaN crystal was grown according to the same procedure as the Inventive Example 1. However, the conditions were changed as follows.
Average particle size of carbon powder: 50 µm
Carbon content: 0.005 atomic percent
Content of gallium: 20 atomic percent
The thus obtained gallium nitride crystal plate had a size φ of 2 inches and was grown on the seed crystal substrate by a thickness of 80 µm. It was measured the thicknesses at the center and additional four points positioned in the upper, lower, right and left sides with respect to the center by distances of 20 mm, respectively. The TTV value was thereby calculated and the deviation was proved to be 6 µm. After the polishing, the surface of the GaN crystal was observed by an optical microscope to confirm good GaN crystal without the openings.

The invention claimed is:

1. A method of producing a crystal of a nitride of a group 13 element for preventing openings on a surface of said crystal, the method comprising the steps of:
   mixing and melting sodium, a source of said group 13 element and carbon powder to obtain a melt, wherein said carbon powder has an average particle size of 1 to 50 µm, wherein said melt comprises sodium, said group 13 element, and carbon, and wherein an amount of carbon is 0.005 to 0.018 atomic percent, provided that 100 atomic percent is assigned to a total amount of a flux comprising said sodium, said group 13 element and carbon in said melt; and
   growing said crystal of said nitride of said group 13 element in said melt under an atmosphere comprising nitrogen.

2. The method of claim 1, wherein said crystal of said nitride of said group 13 element is grown on a seed crystal in said melt.

3. The method of claim 1, wherein said group 13 element comprises gallium and wherein said nitride of said group 13 element comprises gallium nitride.

4. The method of claim 1, wherein said crystal of said nitride of said group 13 element is grown in said melt while said melt is agitated.

5. The method of claim 4, wherein said crystal of said nitride of said group 13 element is grown in said melt in a container while said container is rotated.

* * * * *